(12) United States Patent
Oh

(10) Patent No.: US 7,793,408 B2
(45) Date of Patent: Sep. 14, 2010

(54) APPARATUS FOR TRANSFERRING SEMICONDUCTOR CHIP

(75) Inventor: Kook-Jin Oh, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 190 days.

(21) Appl. No.: 11/954,657

(22) Filed: Dec. 12, 2007

(65) Prior Publication Data
US 2008/0148558 A1   Jun. 26, 2008

(30) Foreign Application Priority Data
Dec. 22, 2006   (KR) ..................... 10-2006-0133080

(51) Int. Cl.
*B23B 19/00* (2006.01)
(52) U.S. Cl. ............... 29/743; 29/729; 29/740; 29/833; 294/64.1
(58) Field of Classification Search ........... 29/740–743; 294/64.1, 902; 228/180.22, 221, 218; 269/21
See application file for complete search history.

(56) References Cited

U.S. PATENT DOCUMENTS

| 4,049,484 A | * | 9/1977 | Priest et al. ................. 156/285 |
| 5,582,086 A | * | 12/1996 | Kogame ...................... 83/152 |
| 6,386,432 B1 | * | 5/2002 | Jin et al. ....................... 29/743 |
| 6,503,356 B1 | * | 1/2003 | Sakai et al. .................... 29/743 |
| 6,663,092 B2 | * | 12/2003 | Kashiwazaki et al. ......... 269/21 |

FOREIGN PATENT DOCUMENTS

| KR | 2005-0095101 | 9/2005 |
| KR | 20-0414775 | 4/2006 |

* cited by examiner

*Primary Examiner*—Minh Trinh
(74) *Attorney, Agent, or Firm*—Muir Patent Consulting, PLLC

(57) ABSTRACT

The apparatus for transferring the semiconductor chip includes: a holder member including a first vacuum hole connected to a vacuum line; a plate member including at least one second vacuum hole corresponding to the first vacuum hole and redistributed to edges of the plate member, the plate member combined with the holder member; and an absorption member including at least one third vacuum hole corresponding to the second vacuum hole and a groove connected to the third vacuum hole, the absorption member combined with the plate member and the holder member.

16 Claims, 5 Drawing Sheets

APPARATUS FOR TRANSFERRING SEMICONDUCTOR CHIP

CROSS-REFERENCE TO RELATED PATENT APPLICATION

This application claims priority under 35 USC §119 to Korean Patent Application No. 10-2006-0133080, filed on Dec. 22, 2006 in the Korean Intellectual Property Office, the contents of which are incorporated herein in their entirety by reference.

BACKGROUND

1. Technical Field

The present invention relates to a semiconductor packaging process, and more particularly, to an apparatus for transferring a semiconductor chip and a method of transferring a semiconductor chip using the same.

2. Description of the Related Art

According to conventional semiconductor manufacturing processes, a plurality of semiconductor chips are fabricated on a wafer at the same time, separated into die units, and packaged separately. For example, wafer-level semiconductor chips are diced into die units and separately attached to a package substrate using an apparatus for transferring semiconductor chips.

A conventional apparatus for transferring a semiconductor chip is constructed by inserting a holder member into an absorption member. Thus, when the holder member is inserted into the absorption member, the flatness of a bottom surface of the absorption member may deteriorate. For example, when the holder member is inserted into a central portion of the absorption member, a central portion of the bottom surface of the absorption member may be depressed.

When a semiconductor chip is picked up using the above-described apparatus for transferring the semiconductor chip, the semiconductor chip is likely to warp toward the central portion of the absorption member. In this case, when the semiconductor chip is attached to a package substrate, an edge of the semiconductor chip is brought into contact with the package substrate before other portions of the semiconductor chip. As a result, air remains between the central portion of the semiconductor chip and the package substrate leaving a void therebetween. Due to the void, adhesion of the semiconductor chip with the package substrate is markedly decreased, thereby lowering the reliability of a semiconductor package.

SUMMARY

The present invention provides an apparatus for transferring a semiconductor chip, which inhibits the occurrence of a void to enhance the reliability of a semiconductor package. Also, the present invention provides a method of transferring a semiconductor chip using the above-described apparatus for transferring the semiconductor chip.

According to an aspect of the present invention, there is provided an apparatus for transferring a semiconductor chip. The apparatus includes: a holder member including a first vacuum hole connected to a vacuum line; a plate member including at least one second vacuum hole corresponding to the first vacuum hole and redistributed to edges of the plate member, the plate member combined with the holder member; and an absorption member including at least one third vacuum hole corresponding to the second vacuum hole and a groove connected to the third vacuum hole, the absorption member combined with the plate member and fixed to the holder member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
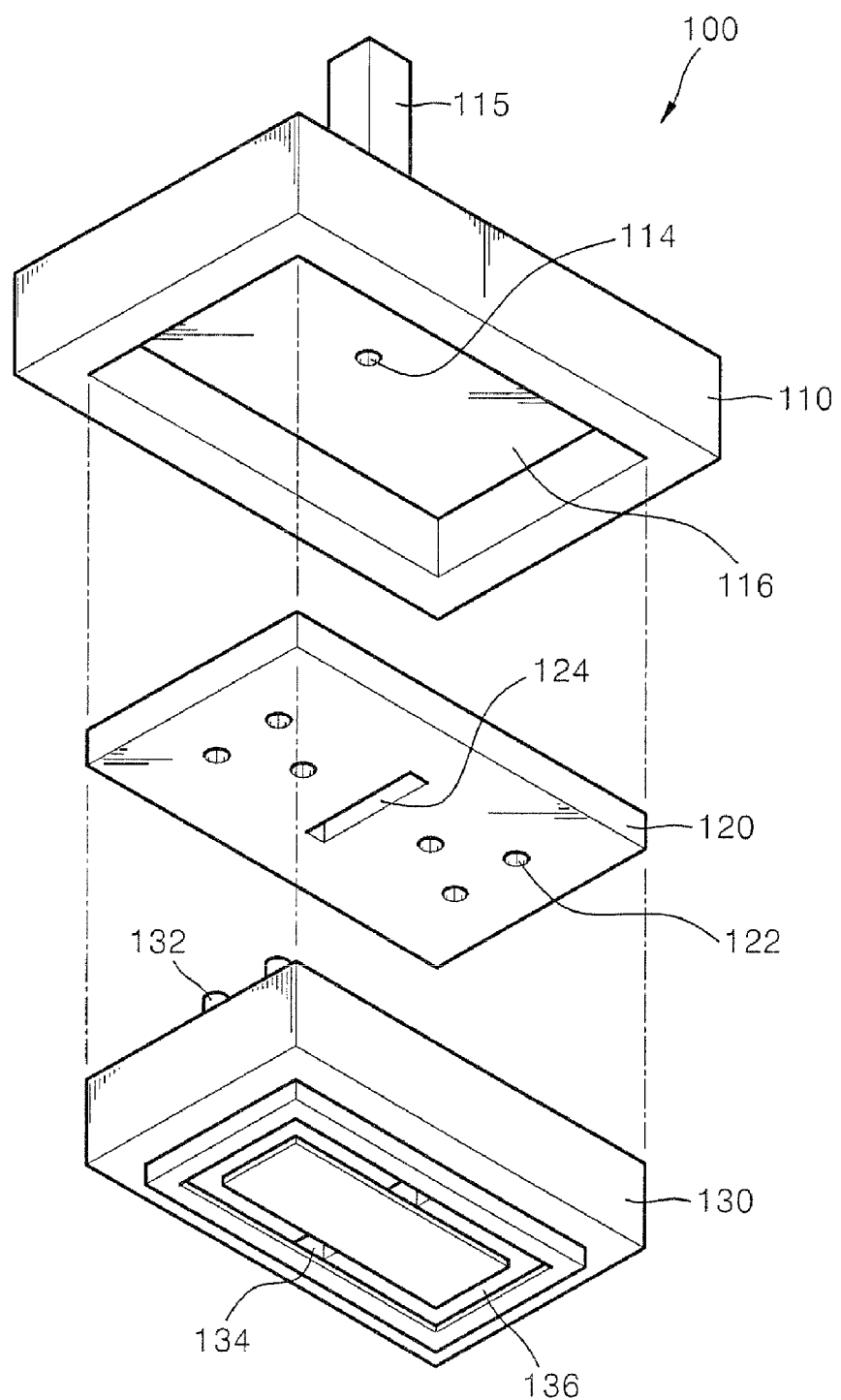
FIG. 1 is an exploded perspective view of an apparatus for transferring a semiconductor chip according to an embodiment of the present invention.
Figure 2:
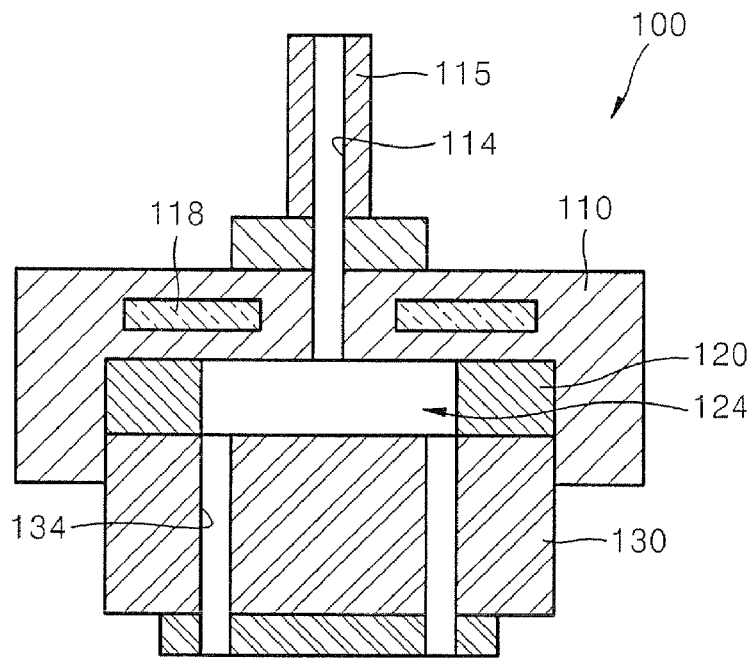
FIG. 2 is a cross-sectional view of the apparatus for transferring a semiconductor chip shown in FIG. 1.

FIG. 1 is an exploded perspective view of an apparatus 100 for transferring a semiconductor chip according to an embodiment of the present invention, and FIG. 2 is a cross-sectional view of the apparatus 100 for transferring a semiconductor chip shown in FIG. 1.

Referring to FIGS. 1 and 2, the apparatus 100 for transferring the semiconductor chip may include a holder member 110, a plate member 120, and an absorption member 130. The holder member 110 may function as a body for fixing the plate member 120 and the absorption member 130. The absorption member 130 may pick up a semiconductor chip (not shown) using vacuum and hold the semiconductor chip. The absorption member 130 is combined with the plate member 120, and the plate member 120 is combined with the holder member 110. Vacuum suction may be externally applied to the holder member 110 and then, applied to the absorption member 130 through the plate member 120.

The holder member 110 may include a vacuum line 115 through which a vacuum is externally applied to the holder member 110. A first vacuum hole 114 is connected to the vacuum line 115 and exposed in a bottom surface 116 of the holder member 110. For example, the first vacuum hole 114 may be formed near the center of the bottom surface 114 of the holder member 110. The vacuum line 115 may be disposed at the center of a top surface of the holder member 110. However, the present invention is not limited to the above-described positions of the first vacuum hole 114 and the vacuum line 115. For example, the vacuum line 115 may be installed on a lateral surface of the holder member 110.

The bottom surface 116 of the holder member 110 may be depressed to easily fix the plate member 120 and/or the absorption member 130 on the bottom surface 116 of the holder member 110. In this case, the plate member 120 and/or the absorption member 130 may be combined with a depressed portion of the bottom surface 116 of the holder member 110. However, the present invention is not limited thereto and the holder member 110 and the plate member 120 may be fixed on the holder member 110 in various other manners. For example, the bottom surface 116 of the holder member 110 may be planar and a top surface of the plate member 120 may be depressed.

The holder member 110 and the plate member 120 may be magnetically combined with each other. Thus, the holder member 110 may be easily combined with and detached from the plate member 120. For instance, the holder member 110 may include a magnet 118, and the plate member 120 may include a metal. Alternatively, the plate member 120 may include a magnet and the holder member 110 may include a metal. The magnet 118 may be distinguished from a material of the holder member 110 or form a portion of the holder member 110. In other words, the holder member 110 may be partially or wholly formed of a magnetic material. The magnetic combination of the holder member 110 with the plate member 120 enables the plate member 120 to be disposed in a precise horizontal direction because no additional combination member is required between the holder member 110 and the plate member 120.

The plate member 120 may have a flattened bottom surface and may comprise a material having high hardness in order to keep the absorption member 130 flat when the absorption member 130 is combined with the holder member 110. For example, the plate member 120 may be attracted by a magnet and include a metal having high hardness, such as iron (Fe). As a result, when the absorption member 130 is directly combined with the holder member 110, the absorption member 130 can remain flat, unlike in the conventional case.

The plate member 120 may include a second vacuum hole 124 corresponding to the first vacuum hole 114. For example, the second vacuum hole 124 may correspond to the first vacuum hole 114 and extend toward the vicinity of both edges of the plate member 120. Thus, the second vacuum hole 124 may extend or relocate a vacuum suction, which is applied toward the center of the plate member 124 by the first vacuum hole 114, toward the edges of the plate member 120.

The plate member 120 may be attached to the absorption member 130 using an adhesive. Furthermore, the plate member 120 may be inserted into the absorption member 130 in order to enhance the adhesion of the plate member 120 to the absorption member 130. For instance, the plate member 120 may include fixing holes 122, and the absorption member 130 may include protrusions 132. Thus, the protrusions 132 of the absorption member 130 may be inserted into the fixing holes 122 of the plate member 120 so that the adhesion of the plate member 120 to the absorption member 130 can be enhanced.

The absorption member 130 may have some elasticity in order to maintain vacuum suction. For example, the absorption member 130 may be formed of a rubber material. The absorption member 130 may include at least one third vacuum hole 134 that corresponds to the second vacuum hole 124. For instance, a pair of third vacuum holes 134 may respectively correspond to both edges of the second vacuum hole 124.

The third vacuum holes 134 may be disposed apart from each other adjacent to edges of the absorption member 130. In other words, the suction of the absorption member 130 may not be centralized on the center of the semiconductor chip but instead dispersed toward an edge of the semiconductor chip. As a result, the center of the semiconductor chip does not warp during a die transfer process, unlike in the conventional case, thereby reducing the occurrence of a void between the semiconductor chip and a package substrate. In other words, according to the present invention, the suction of the absorption member 130 is dispersed to inhibit the occurrence of the void.

Furthermore, the absorption member 130 may include a groove 136 formed in the bottom surface and connected to the third vacuum holes 134. The groove 136 is a depressed region formed in a bottom surface of the absorption member 130 to a predetermined depth. The groove 136 functions to disperse a vacuum suction applied to the third vacuum holes 134. For example, the groove 136 may be formed along four sides of the bottom surface of the absorption member 130. The groove 136 may be smaller than the semiconductor chip and have almost the same shape as the semiconductor chip. The groove 136 aids in dispersing the suction of the absorption member 130 more than when only the third vacuum holes 134 are used. Therefore, the occurrence of the void may be further suppressed during a die transfer process.

Figure 3:
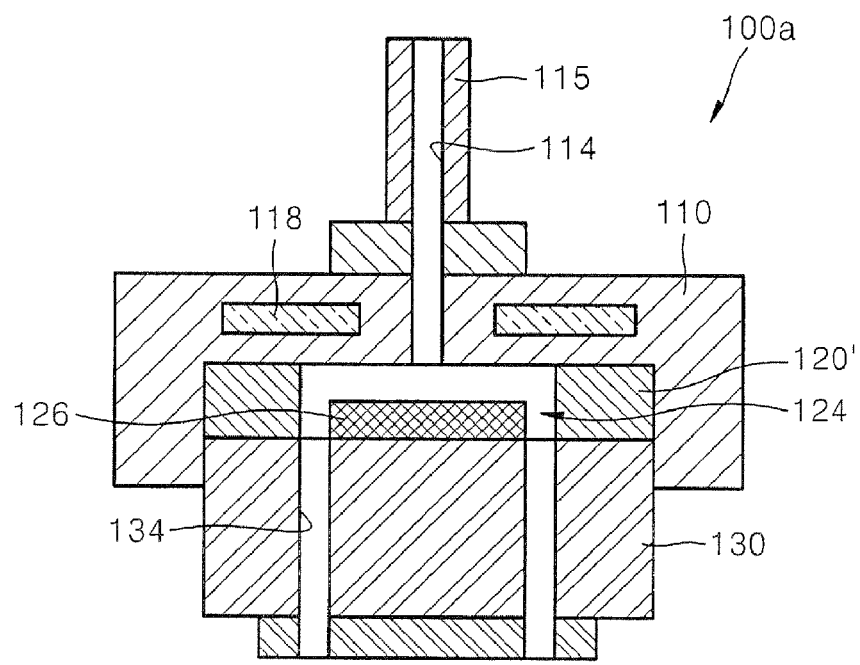
FIG. 3 is a cross-sectional view of an apparatus for transferring a semiconductor chip according to another embodiment of the present invention.

FIG. 3 is a cross-sectional view of an apparatus 100a for transferring a semiconductor chip according to another embodiment of the present invention. The apparatus 100a for transferring a semiconductor chip shown in FIG. 3 is similar to the apparatus 100 for transferring a semiconductor chip shown in FIG. 2 except for a plate member. Thus, a description of the same elements as in FIG. 2 will be omitted here.

Referring to FIG. 3, a plate member 120' may further include a bridge 126, which is recessed in the surface of the plate member 120' between a first vacuum hole 114 and an absorption member 130. The bridge 126 may be disposed in a second vacuum hole 124 and function to relocate a vacuum suction, which is applied from the first vacuum hole 114, toward both corners of the second vacuum hole 124. Thus, a space between the bridge 126 and the holder member 110 may be used as a portion of the second vacuum hole 124.

The second vacuum hole 124 has one upper portion disposed over the bridge 126 and two lower portions. Thus, the second vacuum hole 124 may be regarded as two second vacuum holes. Accordingly, as the number of bridges 126 increases, the number of the second vacuum holes 124 may also increase.

The bridge 126 may be formed of the same material as the other portion of the plate member 120' or a different material from the other portion of the plate member 120'. The bridge 126 may prevent a vacuum suction from being directly applied from the first vacuum hole 114 to a central portion of the absorption member 130. Thus, the bridge 126 can inhibit the central portion of the absorption member 130 from being depressed due to a suction applied from the first vacuum hole 114. As a result, the bridge 126 contributes toward keeping the absorption member 130 flat.

Figure 4:
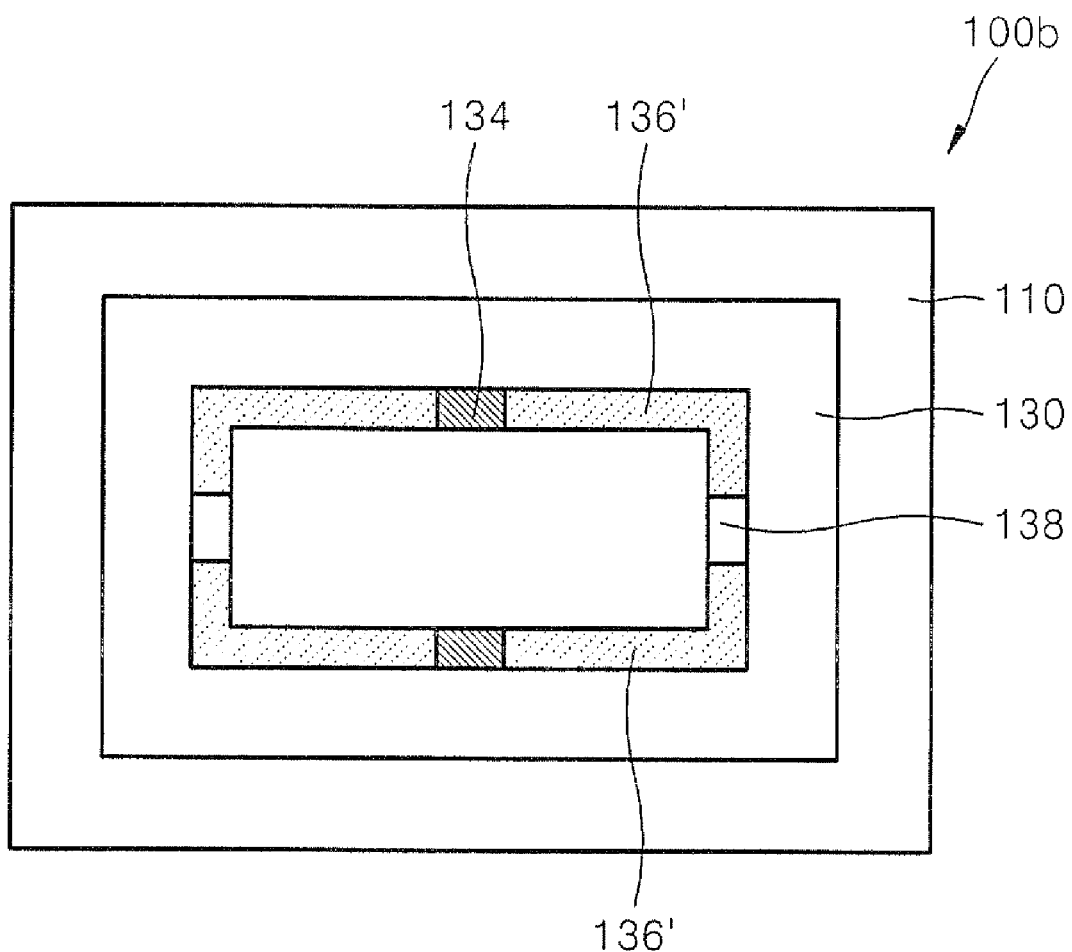
FIG. 4 is a bottom view of an apparatus for transferring a semiconductor chip according to yet another embodiment of the present invention.

FIG. 4 is a bottom view of an apparatus 100b for transferring a semiconductor chip according to yet another embodiment of the present invention. The apparatus 100b for transferring a semiconductor chip shown in FIG. 4 is similar to the apparatus 100 for transferring a semiconductor chip shown in FIG. 2 except for the shape of a groove of an absorption member. Thus, a description of the same elements as in FIG. 2 will be omitted here.

Referring to FIG. 4, grooves 136' are connected to third vacuum holes 134, respectively, and spaced apart from one another by a cutoff portion 138. In this case, the number of the grooves 136' may depend on the number of the third vacuum holes 134. The cutoff portion 138 may be formed of the same material as the other portion of an absorption member 130 or a different material from the other portion of the absorption member 130.

In the current embodiment of the present invention, the grooves 136' are separated from one another so that the vacuum suction of the absorption member 130 can be dispersed. Also, the area of a portion of a semiconductor chip held on the absorption member 130 may be reduced, thereby lowering the likelihood of the occurrence of a void.

Figure 5:
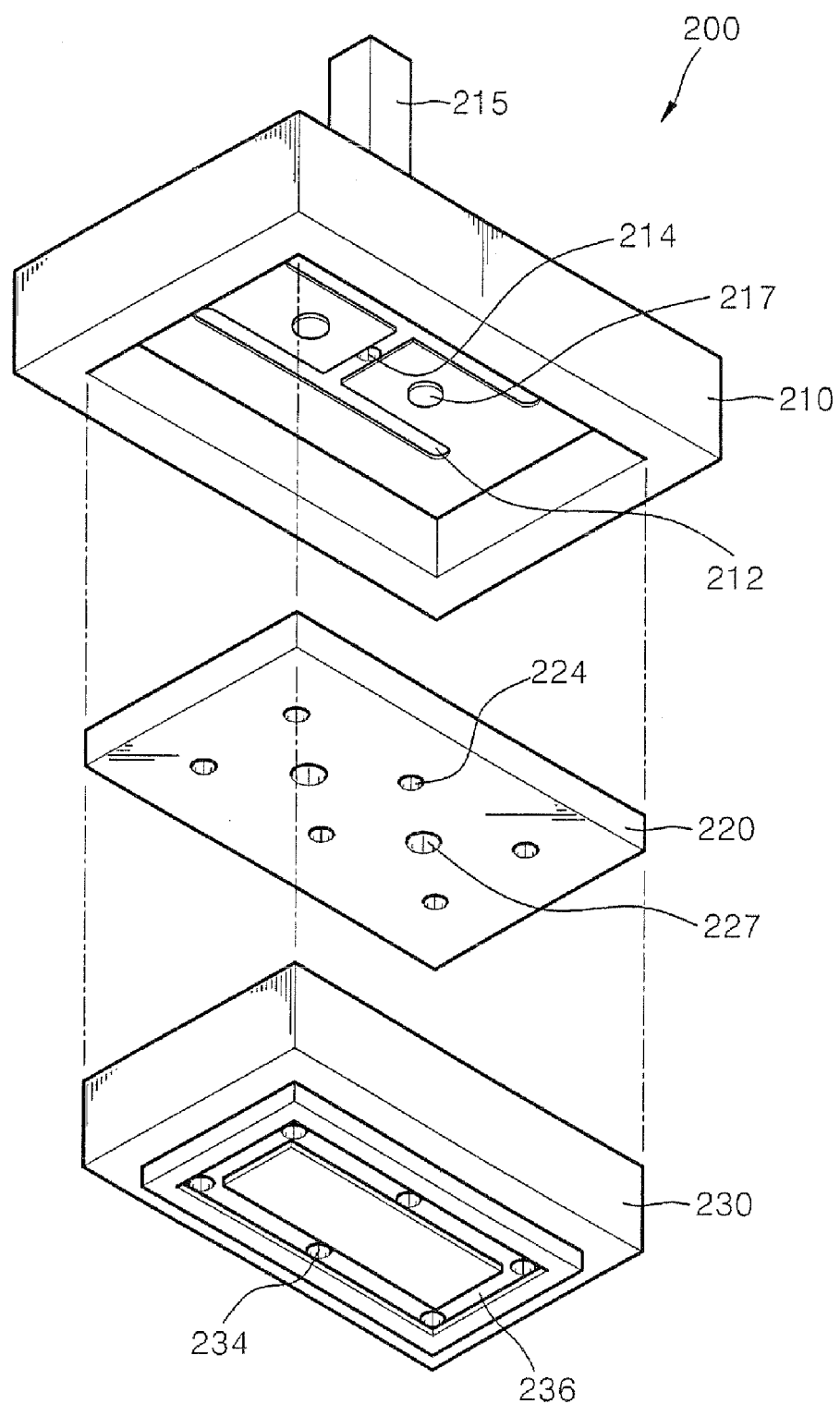
FIG. 5 is an exploded perspective view of an apparatus for transferring a semiconductor chip according to still another embodiment of the present invention.

FIG. 5 is an exploded perspective view of an apparatus 200 for transferring a semiconductor chip according to still another embodiment of the present invention.

Referring to FIG. 5, the apparatus 200 for transferring the semiconductor chip may include a holder member 210, a plate member 220, and an absorption member 230, which may correspond to the holder member 110, the plate member 120, and the absorption member 130, respectively, of FIG. 1.

The holder member 210 may include a first vacuum hole 214 and a groove 212. The first vacuum hole 214 may be connected to a vacuum line 215, and the groove 212 may be connected to the first vacuum hole 214. Thus, the groove 212 may disperse or relocate the vacuum suction of the first vacuum hole 214. For example, the groove 212 may have an "H" shape, but the present invention is not limited thereto.

The holder member 210 and the plate member 220 may be magnetically combined with each other. Furthermore, the holder member 210 and the plate member 220 may be mechanically combined with each other. For example, the holder member 210 may include protruding pins 217, and the plate member 220 may include fixing holes 227. By inserting the pins 217 into the fixing holes 227, the holder member 210 may be mechanically combined with the plate member 220.

The plate member 220 may include a plurality of second vacuum holes 224 disposed apart from one another. The second vacuum holes 224 may respectively correspond to different portions of the groove 212 and thus be connected to the first vacuum holes 214 by the groove 212. Thus, the groove 212 may aid in dispersing a vacuum suction applied to the first vacuum holes 214 toward the second vacuum holes 224. Although six second vacuum holes 224 are shown in FIG. 5, the present invention is not limited thereto and the number of second vacuum holes 224 may be appropriately selected.

The absorption member 230 may include a plurality of third vacuum holes 234 corresponding to the second vacuum holes 224, respectively. The third vacuum holes 234 may be equal in number to the number of second vacuum holes 224. The third vacuum holes 234 may be connected to one another by a groove 236. Since the third vacuum holes 234 are dispersed along edges of the absorption member 230, a vacuum suction is uniformly distributed. Furthermore, the cutoff portion 138 shown in FIG. 4 may be formed in the groove 236 between two of the third vacuum holes 234.

Figure 6:
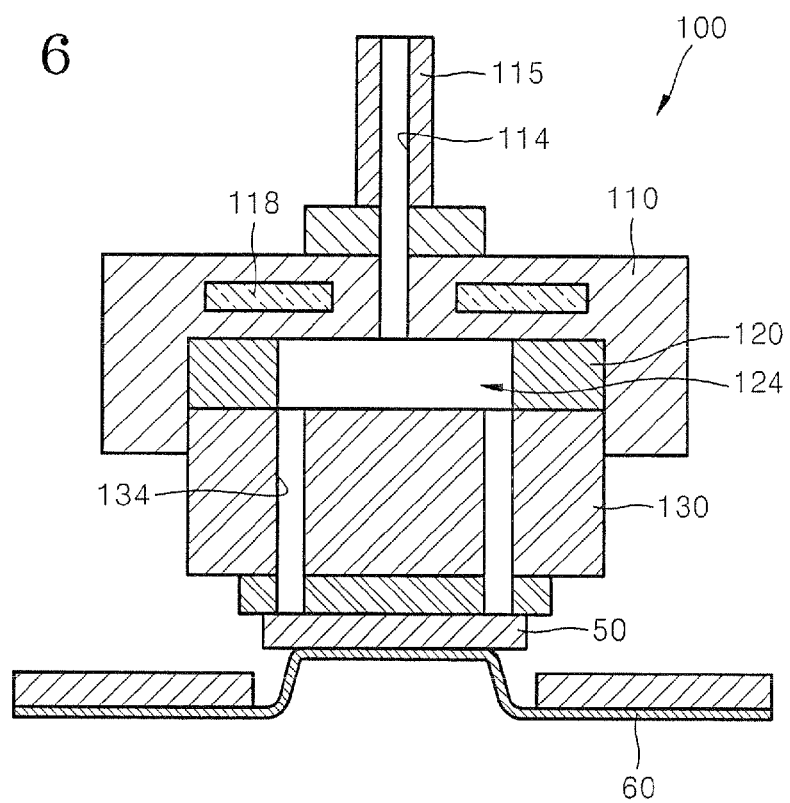
FIGS. 6 and 7 are cross-sectional views illustrating a method of transferring a semiconductor chip according to an embodiment of the present invention.
Figure 7:
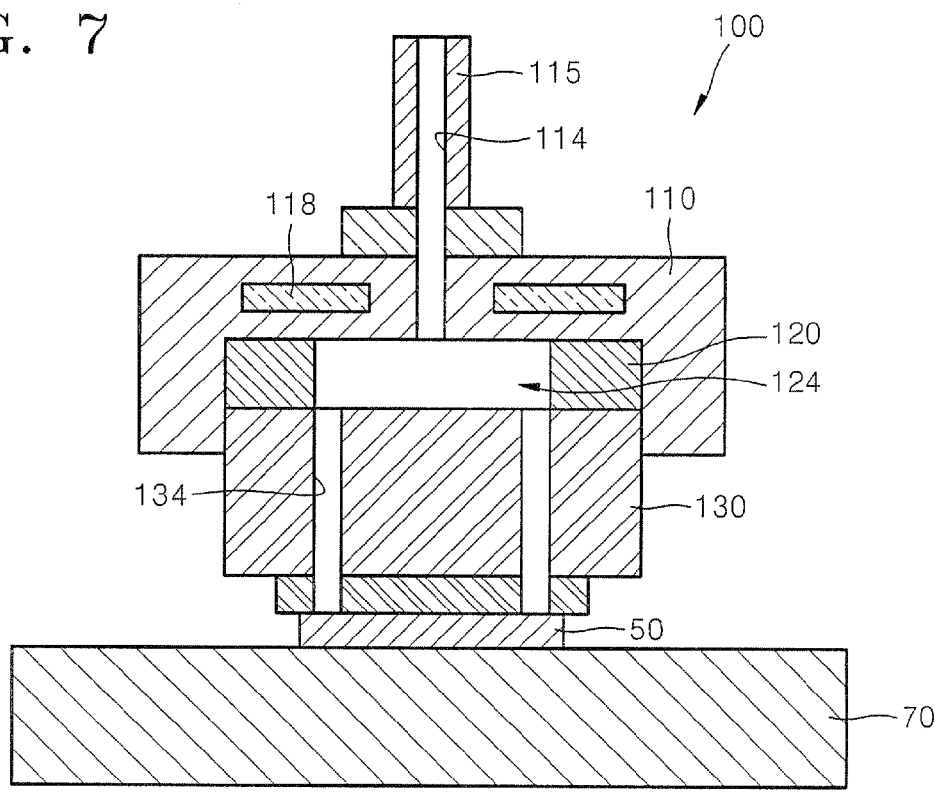

FIGS. 6 and 7 are cross-sectional views illustrating a method of transferring a semiconductor chip according to an embodiment of the present invention. The method will now be described using the apparatus 100 for transferring the semiconductor chip shown in FIGS. 1 and 2.

Referring to FIG. 6, an apparatus 100 for transferring a semiconductor chip is provided. Thereafter, a semiconductor chip 50 is picked up using the apparatus 100. Prior to this step, a plurality of semiconductor chips 50 may be fabricated on a wafer, fixed to a tape 60, and separated into die units apart from one another during a dicing process.

A vacuum is applied to a vacuum line 115, and an absorption member 130 is closely contacted to the semiconductor chip 50, so that the semiconductor chip 50 is picked up on a bottom surface of the absorption member 130. A vacuum suction is applied from the vacuum line 115 through a first vacuum line 114 and a second vacuum line 124 to a third vacuum line 134 and a groove 136. Thus, a central portion of the semiconductor chip 50 is closely fixed to the absorption member 130, and an edge of the semiconductor chip 50 is vacuumed to the absorption member 130. As a result, the central portion of the semiconductor chip 50 is not concavely warped due to the vacuum suction, unlike in the conventional case.

Thereafter, the apparatus 100 is lifted so that the semiconductor chip 50 may be detached from the tape 60. In this process, the semiconductor chip 50 may be pushed up from under the tape 60 using an ejector (not shown) to facilitate the separation of the semiconductor chip 50 from the tape 60. Thereafter, the semiconductor chip 50 may be transferred to a desired position using the apparatus 100.

Referring to FIG. 7, the semiconductor chip 50 may be attached to a package substrate 70. This process may be referred to as a die-attaching process. Specifically, the apparatus 100 for transferring the semiconductor chip is contacted to the package substrate 70 and pressure is applied to the apparatus 100 and the package substrate 70 so that the semiconductor chip 50 may be attached to the package substrate 70. Subsequently, a vacuum is removed from the vacuum line 115 so that the semiconductor chip 50 may be detached from the apparatus 100. According to some embodiments, when the vacuum is removed from the vacuum line 115, a positive pneumatic pressure may be provided in the vacuum line 115 to ensure the semiconductor chip 50 is released from the apparatus 100.

Prior to placing the semiconductor chip 50 on the package substrate 70, the package substrate 70 may be prepared by applying an adhesive to the package substrate in an area that is to receive the semiconductor chip 50. According to conventional methods, when a semiconductor chip is placed on the adhesive, warpage at the center of the semiconductor chip can result in voids because the edges of the semiconductor chip engage with the adhesive, but the center does not. However, according to some embodiments of the present invention, the semiconductor chip 50 is not warped at the center and thus the occurrence of voids is minimized.

It should be apparent to one of ordinary skill that the method of transferring the semiconductor chip as described above with reference to FIGS. 6 and 7 can be applied to the apparatuses 100a, 100b, and 200 of FIGS. 3 through 5.

In an apparatus for transferring a semiconductor chip according to embodiments of the present invention, an absorption member can be maintained flat and fixed to a holder member using a plate member. Thus, when a semiconductor chip is picked up on the absorption member, the warpage of the semiconductor chip can be reduced.

Also, in the apparatus for transferring the semiconductor chip according to the embodiments of the present invention, vacuum holes can be relocated to edges of the absorption member. As a result, the vacuum suction of the absorption member may be dispersed toward edges of the semiconductor chip so that the occurrence of a void between the semiconductor chip and a package substrate can be inhibited.

According to an aspect of the present invention, there is provided an apparatus for transferring a semiconductor chip. The apparatus includes: a holder member including a first vacuum hole connected to a vacuum line; a plate member including at least one second vacuum hole corresponding to the first vacuum hole and redistributed to edges of the plate member, the plate member combined with the holder member; and an absorption member including at least one third vacuum hole corresponding to the second vacuum hole and a groove connected to the third vacuum hole, the absorption member combined with the plate member and fixed to the holder member.

The holder member and the plate member may be magnetically combined with each other.

The plate member may include a bridge recessed in the surface of the plate member between the first vacuum hole of the holder member and the absorption member, and a space between the bridge and the holder member may be used as a portion of the second vacuum hole.

The groove of the absorption member may be formed along edges of a bottom surface of the absorption member.

According to another aspect of the present invention, there is provided a method of transferring a semiconductor chip. The method includes: providing an apparatus for transferring the semiconductor chip; picking up the semiconductor chip using the third vacuum hole and the groove by applying a vacuum to the vacuum line and contacting a bottom surface of the absorption member to the semiconductor chip; and transferring the semiconductor chip to a package substrate using the apparatus for transferring the semiconductor chip.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for transferring a semiconductor chip, the apparatus comprising:
   a holder member including a first vacuum hole connected to a vacuum line;
   a plate member including at least one second vacuum hole corresponding to the first vacuum hole and redistributed toward edges of the plate member, the plate member combined with the holder member; and
   an absorption member combined with the plate member and the holder member, the absorption member including:
      a plurality of third vacuum holes corresponding to the second vacuum hole; and
      a groove recessed from a bottom surface of the absorption member,
   wherein each of the plurality of third vacuum holes is formed in the groove.

2. The apparatus of claim 1, wherein the holder member and the plate member are magnetically combined with each other.

3. The apparatus of claim 2, wherein the holder member includes a magnet and the plate member includes a metal.

4. The apparatus of claim 2, wherein the plate member includes a magnet and the holder member includes a metal.

5. The apparatus of claim 4, wherein the magnet is attached at the bottom of the plate member.

6. The apparatus of claim 1, wherein the second vacuum hole of the plate member extends toward edges of the plate member on both sides of the first vacuum hole.

7. The apparatus of claim 6, wherein the plate member includes a bridge recessed in the surface of the plate member between the first vacuum hole of the holder member and the absorption member,
   wherein a space between the bridge and the holder member is used as a portion of the second vacuum hole.

8. The apparatus of claim 1, wherein the groove of the absorption member is formed along edges of a bottom surface of the absorption member.

9. The apparatus of claim 1, further comprising a plurality of grooves, wherein the plurality of grooves are connected to the plurality of third vacuum holes and are spaced apart from one another by an at least one cutoff portion.

10. The apparatus of claim 1, wherein the plate member further includes a fixing hole and the absorption member further includes a protrusion corresponding to the fixing hole.

11. The apparatus of claim 1, wherein the holder member further includes a groove connected to the first vacuum hole.

12. The apparatus of claim 11, wherein the plate member includes a plurality of second vacuum holes connected to different portions of the groove of the holder member and disposed apart from one another.

13. The apparatus of claim 1, wherein the holder member and the plate member are mechanically combined with one another.

14. The apparatus of claim 1, wherein the plate member comprises a plurality of fixing holes and the holder member includes a plurality of protrusions corresponding to the fixing holes.

15. The apparatus of claim 1, wherein the groove shape is substantially the same as the semiconductor chip.

16. The apparatus of claim 1, wherein the groove size is smaller than the semiconductor chip.

* * * * *